(12) United States Patent
Chang

(10) Patent No.: US 7,288,726 B2
(45) Date of Patent: Oct. 30, 2007

(54) HOLLOW WIRE AND METHOD FOR MAKING THE SAME

(75) Inventor: Liann-Be Chang, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 247 days.

(21) Appl. No.: 10/963,450

(22) Filed: Oct. 13, 2004

(65) Prior Publication Data

US 2006/0076157 A1   Apr. 13, 2006

(51) Int. Cl.
*H01R 12/04* (2006.01)
*H05K 1/11* (2006.01)
(52) U.S. Cl. ....................... 174/261; 174/254
(58) Field of Classification Search ........... 174/251, 174/254, 261
See application file for complete search history.

(56) References Cited

U.S. PATENT DOCUMENTS

| 5,239,448 | A  | * | 8/1993 | Perkins et al. ............ 361/764 |
| 5,544,018 | A  | * | 8/1996 | Sommerfeldt et al. ...... 361/792 |
| 6,852,932 | B2 | * | 2/2005 | Achari et al. .............. 174/262 |
| 6,916,996 | B2 | * | 7/2005 | Kuan et al. ................ 174/262 |

* cited by examiner

*Primary Examiner*—Jeremy C Norris
(74) *Attorney, Agent, or Firm*—Mark A. Mersereau; Nikolai & Mersereau, P.A.

(57) ABSTRACT

A hollow wire for enhancing the wires used in a Liquid Crystal Display includes hollow portions so as to increase the cross sectional area and reduce the resistance. An isolation layer with a low dielectric constant is filled in the hollow portions so as to reduce the clecti-ic capacities and maintain the operation efficiency. The isolation layer can be filled in the perpendicularly crossing area between the information lines and gate matrixes to reduce the electric capacities and maintain the operation efficiency. A method for making the hollow wire is also disclosed.

5 Claims, 10 Drawing Sheets

HOLLOW WIRE AND METHOD FOR MAKING THE SAME

FIELD OF THE INVENTION

The present invention relates to a multi-metal wire used in semi-conductors and, particularly, to a hollow wire that reduces the series resistance of the wire together with the parasitic capacitance between wires and that improves the operation efficiency.

BACKGROUND OF THE INVENTION

A higher standard and quality is requested for audio and video equipment due to rapid progress of multiple media. Conventional, monitors made of a Cathode Ray Tube (CRT) are not desirable due to requests for thin, compact and durable designs. Plasma Display Panels (PDP), Liquid Crystal Displays (LCD) or Field Emitting Displays (FED) gradually replace the Cathode Ray Tube (CRT) in the market.

The cross sectional area of the metal wires and the correspondent gaps between them in the Liquid Crystal Displays (LCD) has to be narrowed due to the increase of pixels. However, the series resistance of the wires and the parasitic capacitance between the wires are increased when the cross sections and the gaps are narrowed, and the interruption of series capacitance between wires is more seriously concerned.

A multi-layer of wire having more cross sectional area is used to reduce resistance, such as disclosed in Taiwan Patent No. 533325. According to the Skin Effect, the electric charges move along the surface of the conductive objects so that the depth of the conductive objects is increased so as to maintain the narrow gaps between the wires. This becomes a multi-layer structure deemed to be a material-consuming design. A thick wire perpendicularly and alternatively located between the information line and gate matrixes causes protrusion on the surface and is difficult to be manufactured. It is also possible to reduce the operation efficiency of the LCDs because of the cross-talk noise due to the distance between the wires being too close.

The conventional way of arrangement of wires of LCDs results in high resistance, lower operation efficiency and interruption of series capacitance, and these affect the quality of the LCDs. This invention overcomes the shortcomings.

SUMMARY OF THE INVENTION

The present invention relates to a hollow wire that overcomes the shortcomings of series resistance and interruption by capacitance.

The main character for achieving the above mentioned purposes is that the hollow wire of the present invention comprises a baseboard and a first main wire. A plurality of sections of separated and co-axial first sub-wires are located on the base board. Conductive material is respectively located on the two ends of the first main wire and the first sub-wires. The top surfaces of the conductive material are flush with each other. A plurality of second sub-wires is axially formed on the top the conductive material on the first main wire. A second main wire is connected across the conductive material on the first sub-wires, and the first main wire is located beneath the second main wire. The hollow wire includes upper layer wires and lower layer of wires which are alternatively arranged with the upper layer of wires.

Another object of the present invention is to provide a method for making the hollow wire which reduces both the series resistance and the interruption of capacitance and which improves the operation efficiency.

In addition, the following steps are taken to manufacture the hollow wire of the present invention:

A. Coating a Metal Layer

A first metal layer 20 is coated on a semi conductor base board;

B. Making Wires

The first metal layer is defined with the first main wire and with the first sub-wires which are located on the same axis and separated by the first main wire.

C. Coating Isolation Layer

An isolation layer is coated on the base board and covers the first main wire and the first sub-wires.

D. Defining Recesses

Several recesses are defined in the isolation layer and located corresponding to the two ends of the first main wire and the second sub-wires. A separation block is located between the two recesses located on the two ends of the first main wire such that the upper layer of metal wires form separated hollow portions.

E. Forming Conductive Material

Conductive material is filled in the recesses.

F. Making Metal Layer

A second metal layer is coated on the isolation layer and covers and is connected with the conductive material.

G Forming Wires

A second metal layer is coated on the isolation layer and covers and is connected with the conductive material.

H. Removing the Isolation Layer

The isolation layer is removed.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 9:
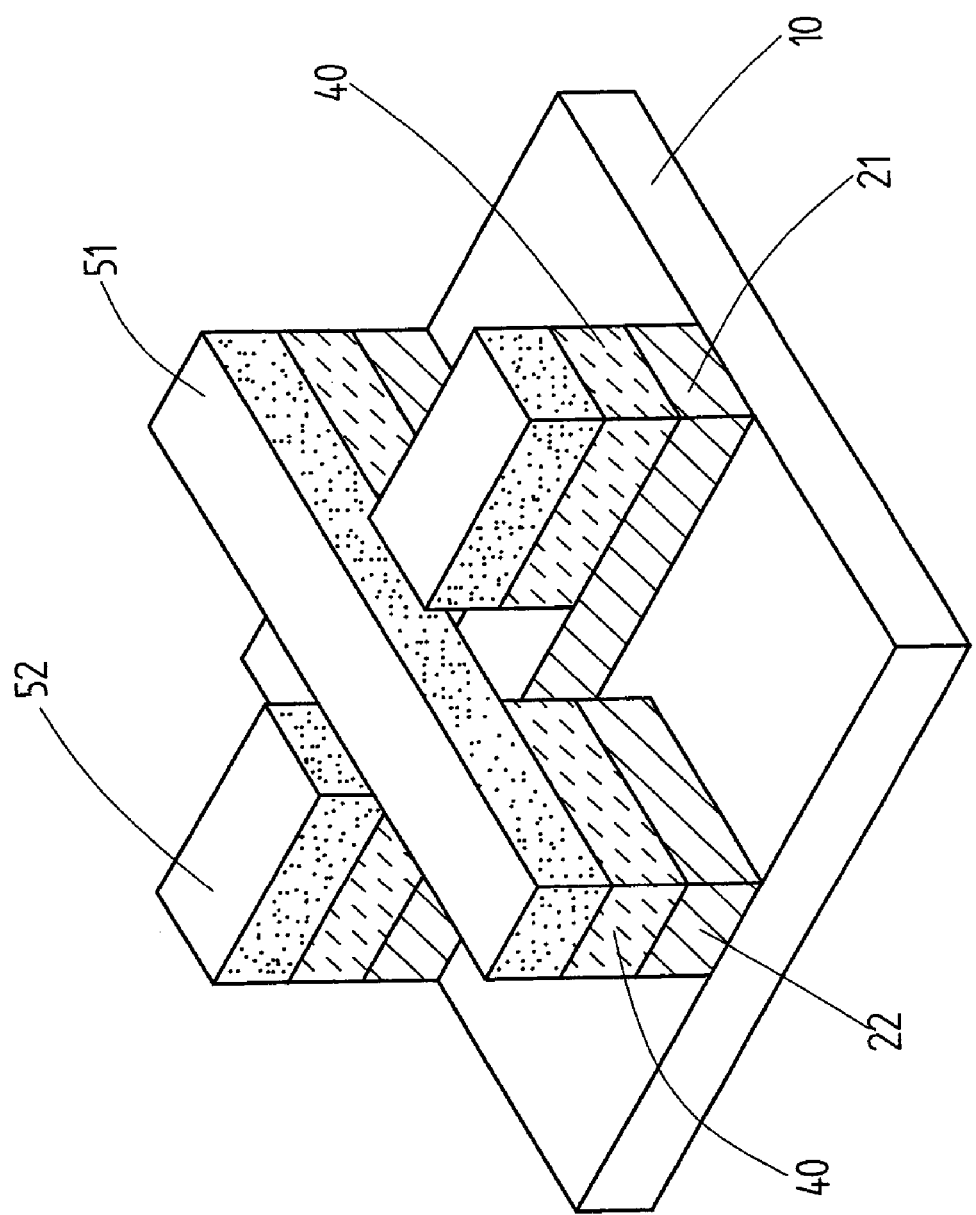
FIG. 9 shows the final status of the hollow wire of the present invention.

Referring to FIG. 9, the hollow wire of the present invention comprises a base board 10 and a first main wire 21. A plurality of sections of separated first sub-wires 22 are located on the base board 10. The first sub-wires 22 share the same axis and are separated from each other. Conductive material 40 is, respectively, located on two ends of the first main wire 21 and the first sub-wires 22. The top surfaces of the conductive material 40 are flush with each other. A plurality of second sub-wires 52 are axially formed on the top surfaces of the conductive material 40 on the first main wire 21. A second main wire 51 is connected across the conductive material 40 on the first sub-wires 22, and the first main wire 21 is located beneath the second main wire 51 perpendicularly.

To achieve the structure mentioned above, the following steps are taken:

A. Coating a First Metal layer 20

Figure 1:
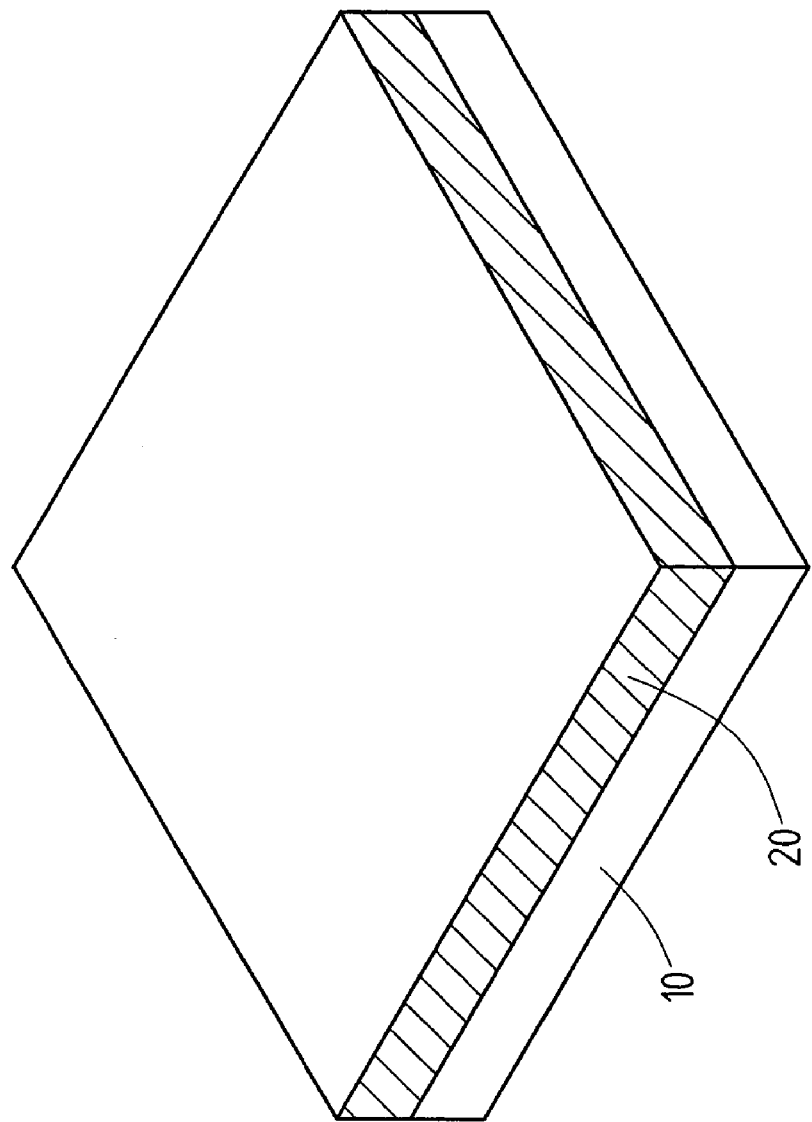
FIG. 1 shows a first metal layer coated on the base board.

Referring to FIG. 1, a first metal layer 20 is coated on a semi conductor base board 10 by way of a chemical or physical method. The base board 10 can be made by Silicon, Gallium Arsenide, Indium Phosphide, Gallium Nitride, Silicon Oxide, Silicon Carbide, Aluminum Oxide, or Zinc Oxide. The first metal layer 20 can be Aluminum, Aluminum alloy, Copper or Copper alloy.

B. Making Wires 21, 22

Figure 2:
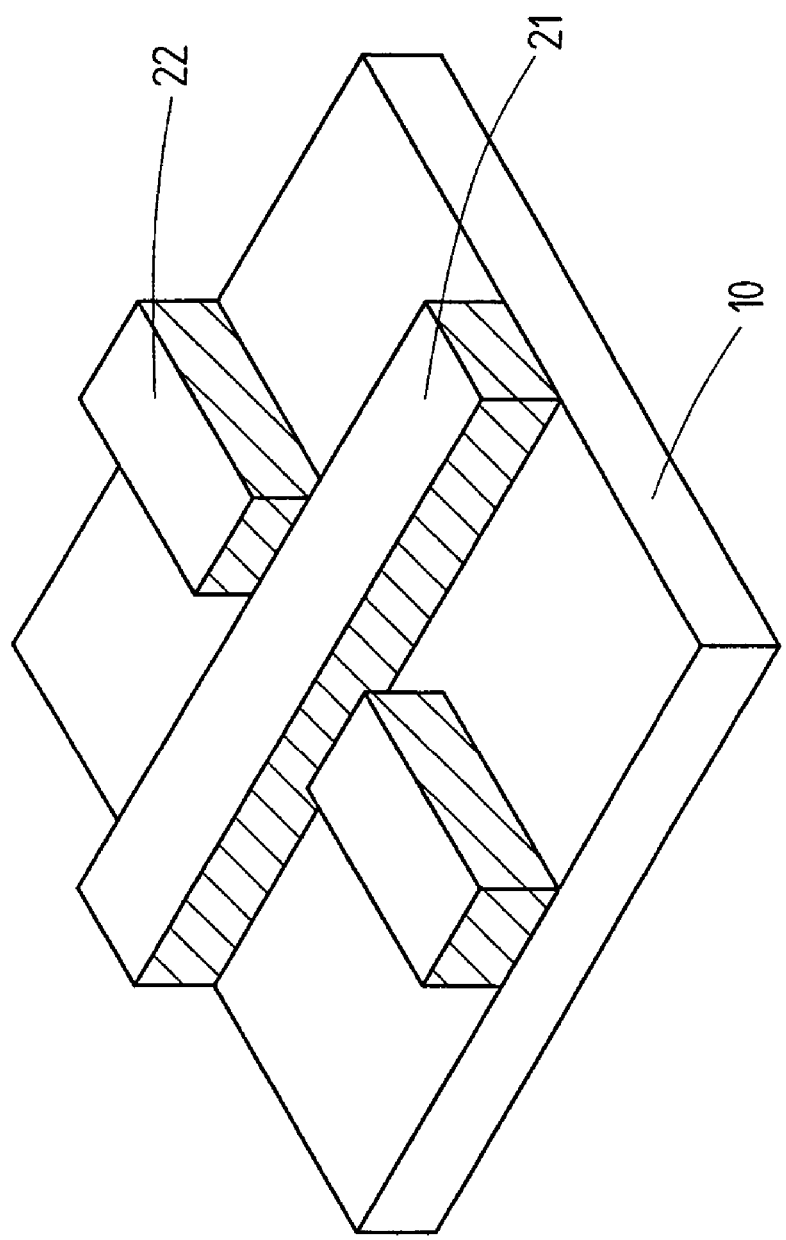
FIG. 2 shows the etching of the first metal layer on the base board.

Referring to FIG. 2, by using exposing and etching, the first metal layer 20 is defined with the first main wire 21 and the first sub-wires 22. The top of the first main wire 21 and the top of the first sub-wires 22 are flush with each other.

C. Coating Isolation Layer 30

Figure 3:
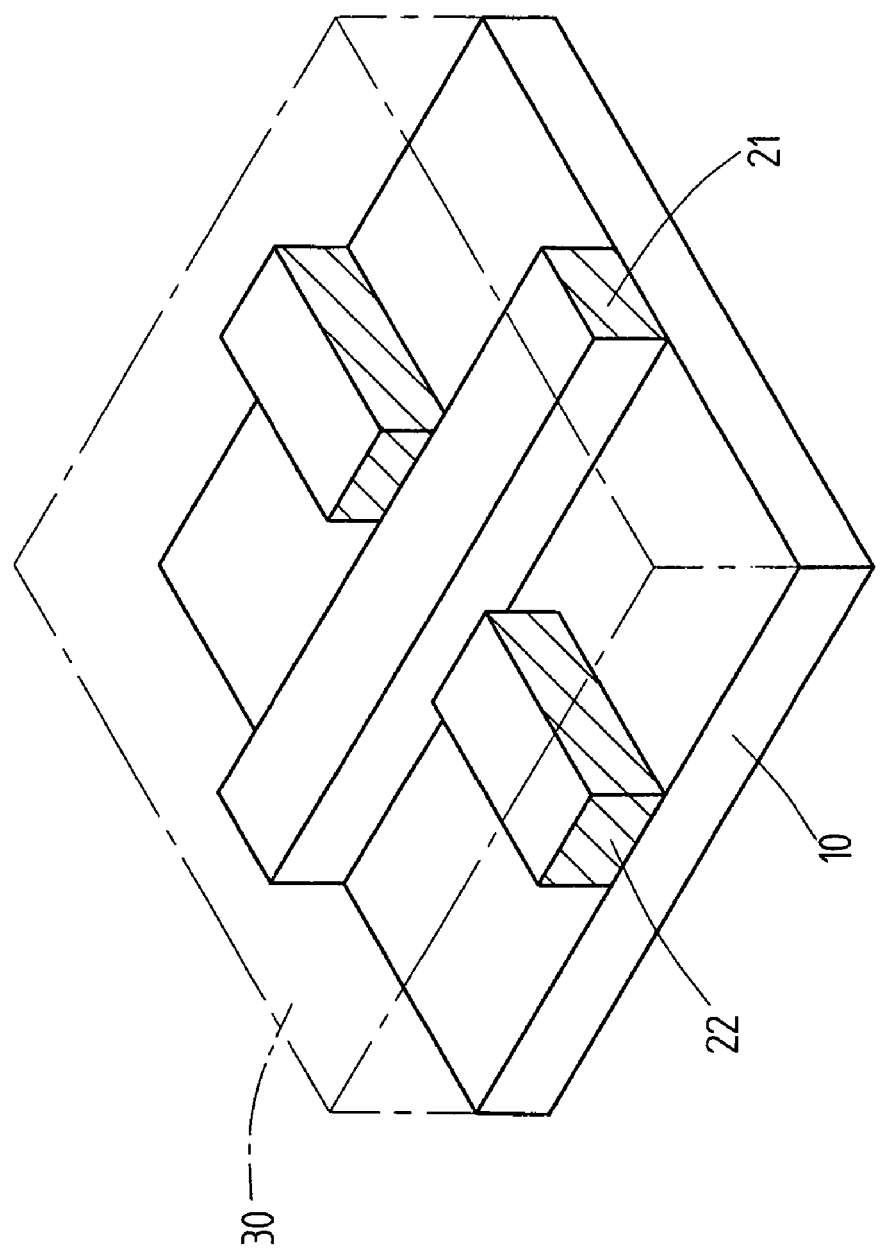
FIG. 3 shows an isolation layer coated on the base board.

Referring to FIG. 3, an isolation layer 30 is coated on the base board 10 and covers the first main wire 21 and the first sub-wires 22. The thickness of the isolation layer 30 is thicker than that of the first main wire 21 and the first sub-wires 22. The isolation layer 30 can be Silicon Oxide, and especially for an ILD with a low dielectric constant, can be made of Tetraethoxysilane, Si(OC2H2)4 or Spin On Glass, SOG.

D. Defining Recesses 31

Figure 4:
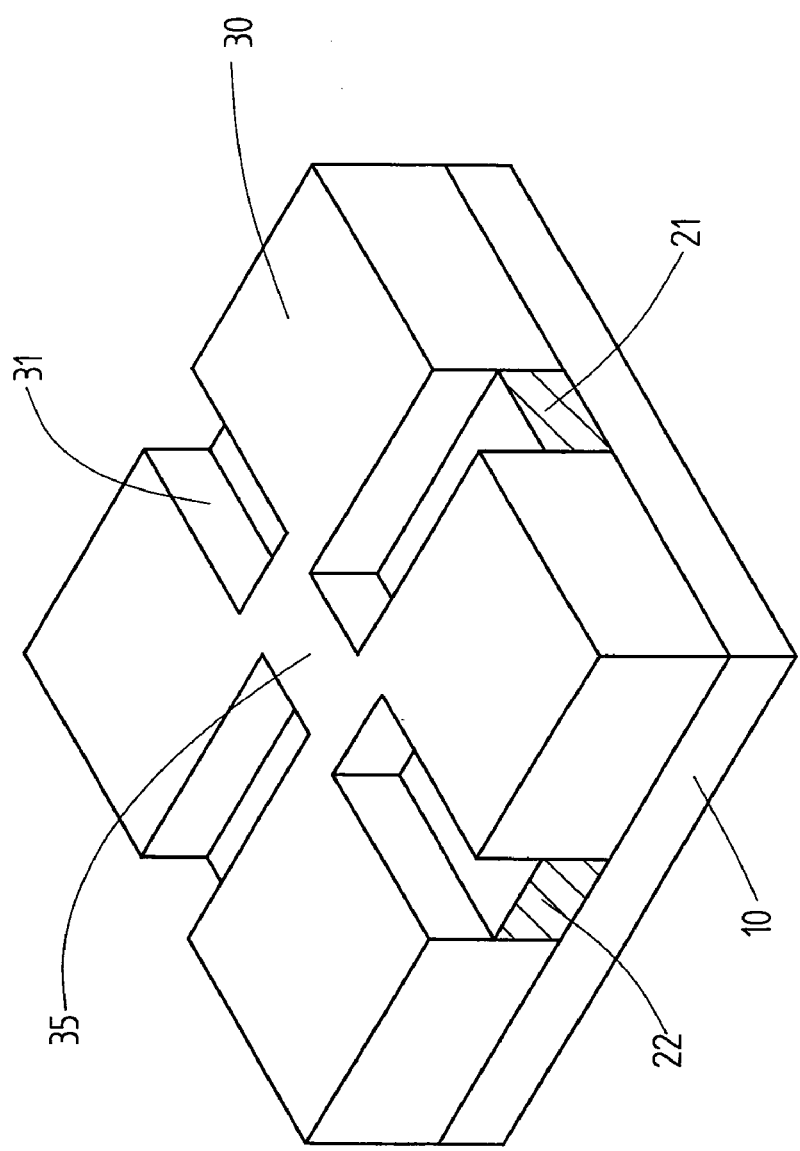
FIG. 4 shows recesses defined in the isolation layer.

Referring to FIG. 4, recesses 31 are defined in the isolation layer 30 and located corresponding to the two ends of the first main wire 21 and the second sub-wires 22. The first metal layer 20 at the two ends of the first main wire 21 and the second sub-wires 22 can be accessible such that the upper Layer of metal wires 51. 52 are connected therewith. A separation block 35 is located between the two recesses 31 located on the two ends of the first main wire 21 such that the upper layer of wires 51, 52 form separated hollow portions.

E. Forming Conductive Material 40

Figure 5A:
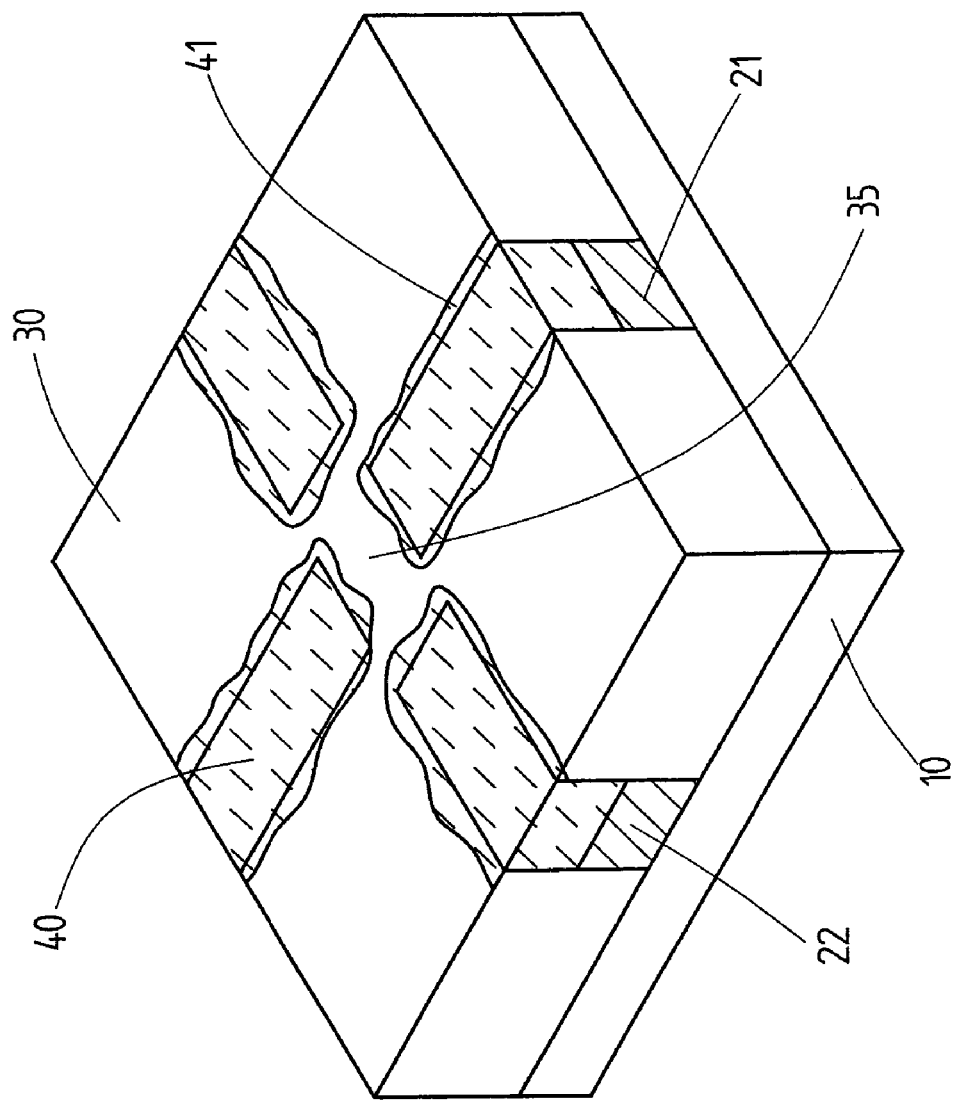
FIG. 5A shows conductive material filled in the recesses.
Figure 5B:
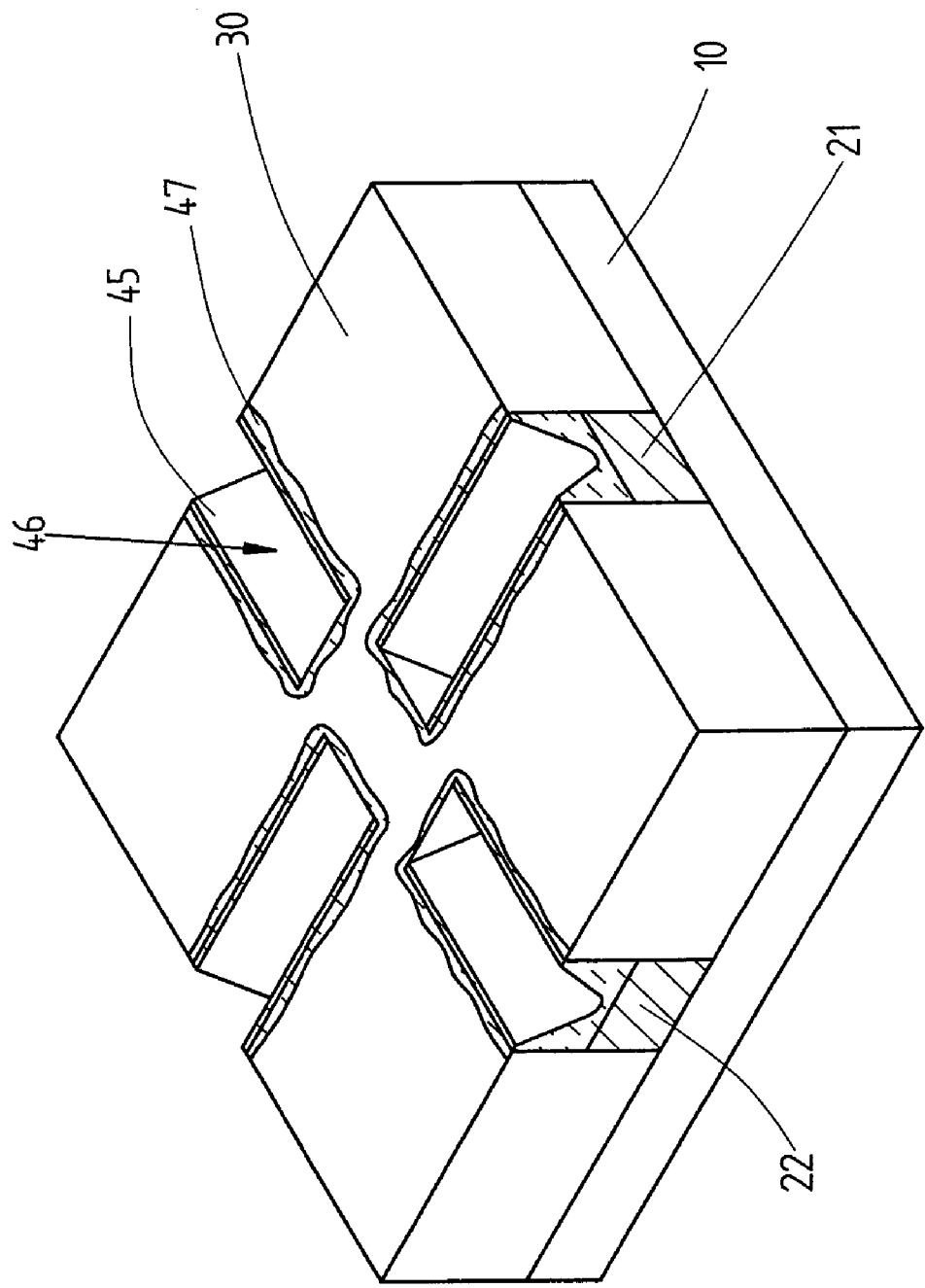
FIG. 5B shows a part of the conductive material removed from the recesses.
Figure 6:
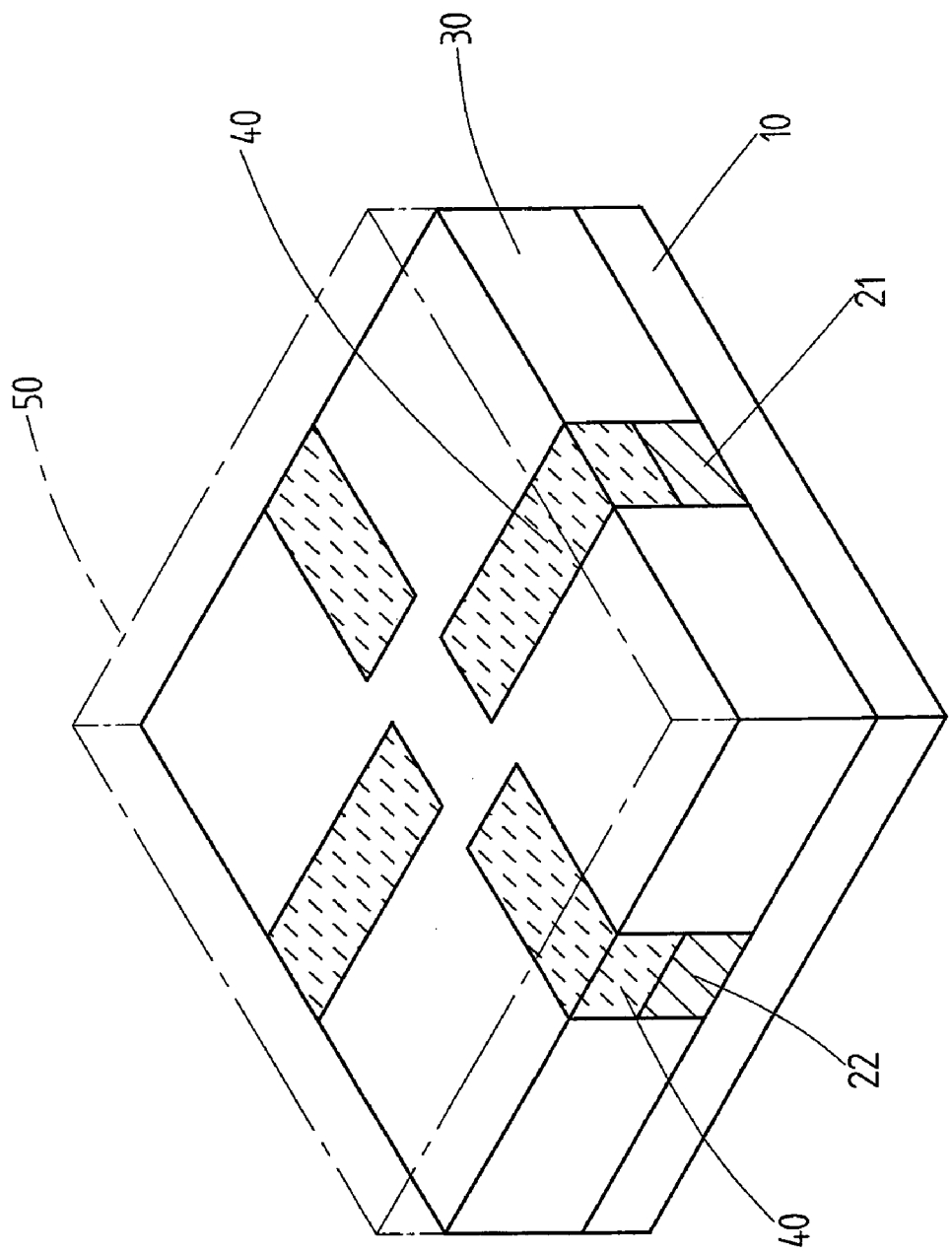
FIG. 6 shows a second metal layer being coated.

Referring to FIG. 5, after the recesses 31 are defined in the isolation layer 30, conductive material 40 is filled in the recesses 31 by way of accumulation of crystals as shown in FIG. 5A. Surplus 41 is formed on the peripheries of the top of the conductive material 40 and then removed by way of CMP to obtain a flat surface as shown in Fig.6. As shown in FIG. 5B, the conductive material 40 may have grooves 46 to save material. The surplus 41 on the top surface of the conductive material 40 with grooves 46 can also be removed by way of CMP.

F. Making metal Layer 50

Referring to FIG. 6, after the conductive material 40 is filled in the recesses 31 in the isolation layer 30, a second metal layer 50 is coated on the isolation layer 30 by way of chemical or physical crystal accumulation. The second metal layer 50 covers and is connected with the conductive material 40.

G. Forming Wires 51, 52

Figure 7:
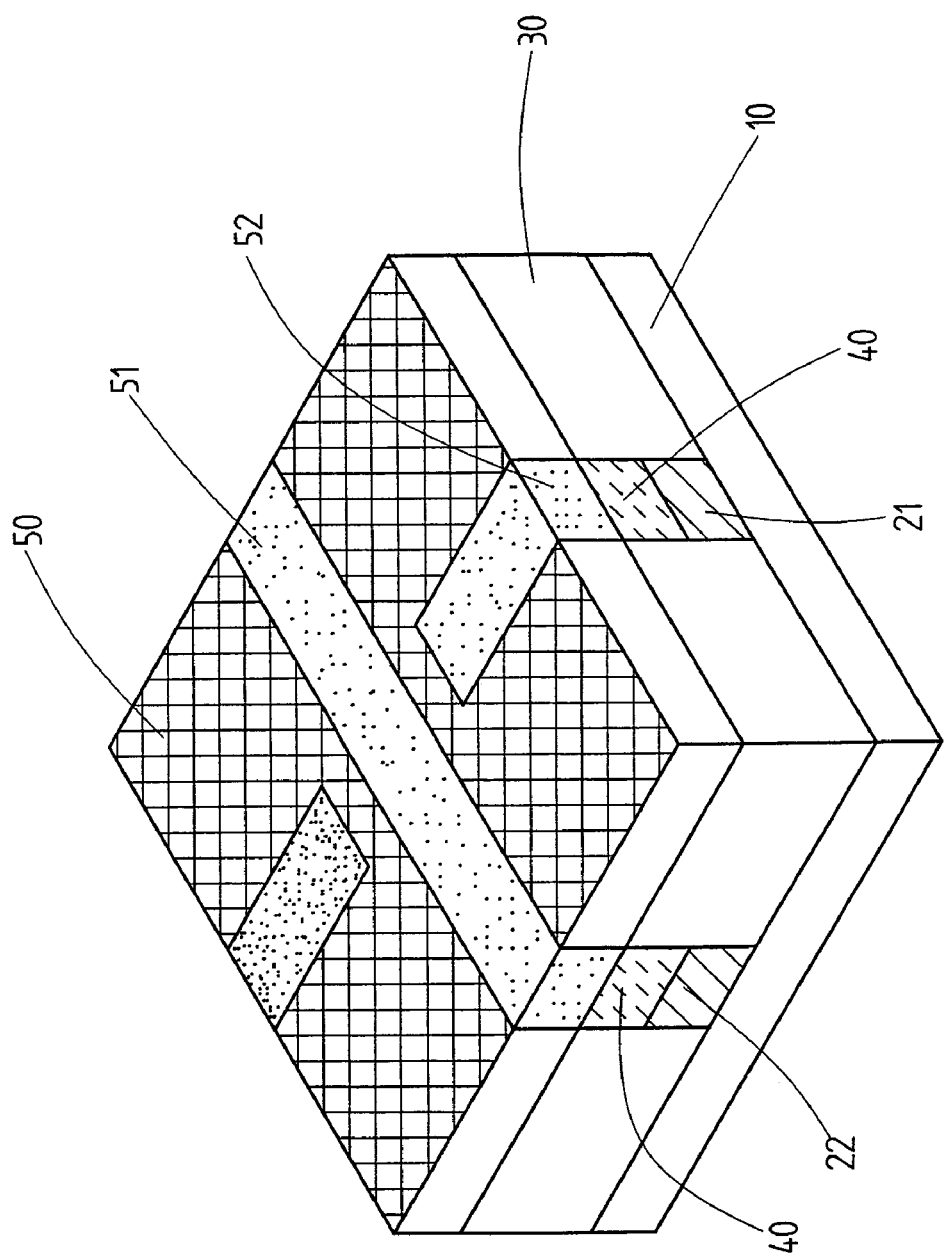
FIG. 7 shows the etching process proceeding to the second metal layer.
Figure 8:
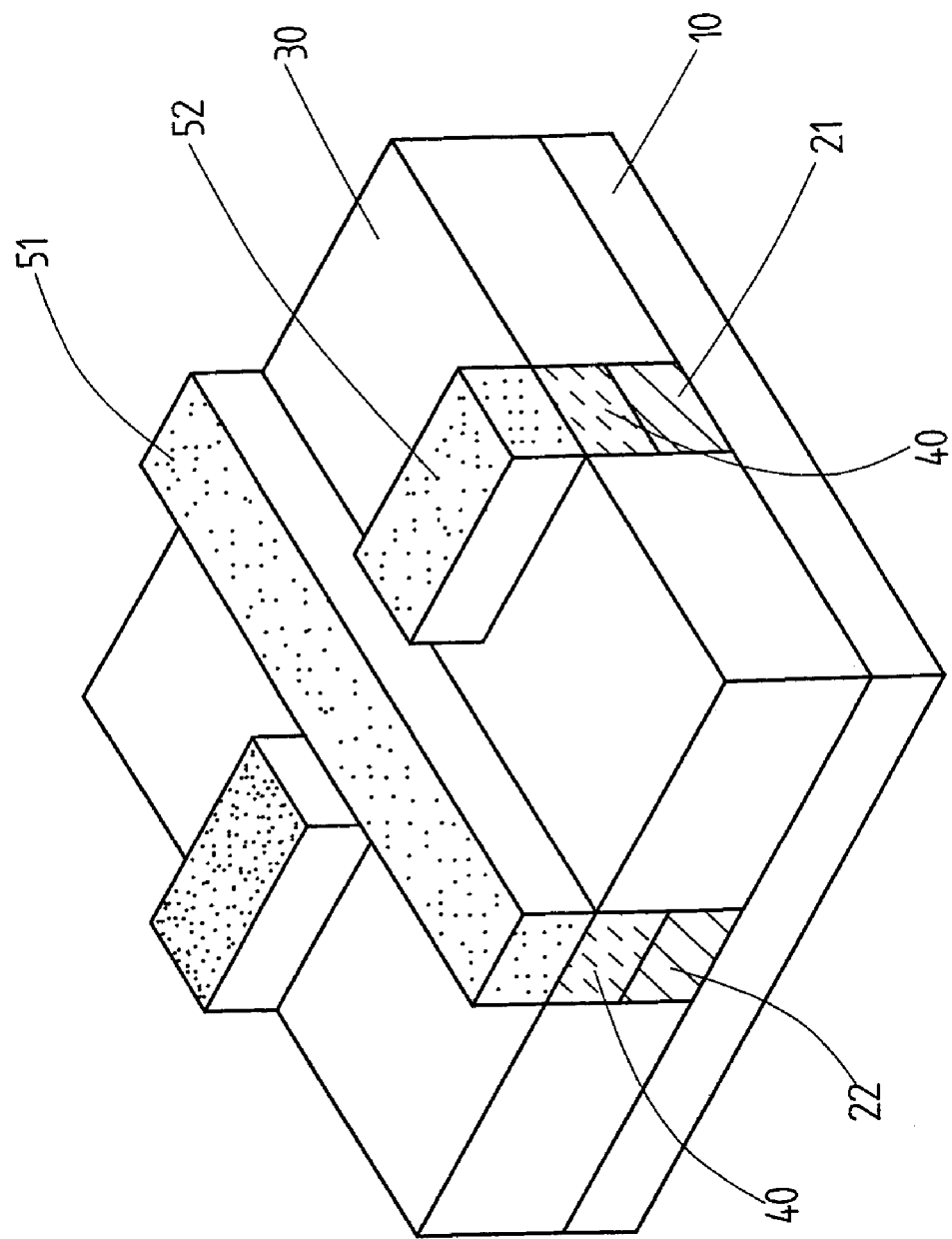
FIG. 8 shows the etching of the second metal layer.

As shown in FIGS. 7 and 8, using exposing technique forms a second main wire 51 and a plurality of sections of second sub-wires 52 which share the same axis and are separate from each other. The second main wire is perpendicularly located between the second sub-wires 52. The second main wire 51 and the second sub-wires 52 are in flush with each other on their top surfaces. The second main wire 51 is located corresponding to the first sub-wires 22 and are electrically connected to the first sub-wires 22 by the conductive material 40. The second sub-wires 52 are located corresponding to the first main wire 21 and are electrically connected to the first main wire 21 by the conductive material 40. The surplus portion of the second metal layer 50 is removed by way of etching.

H. Removing the Isolation Layer 30

As shown in FIG. 9, the second main wire 51 and the second sub-wires 52 are formed in the second metal layer 50. The second main wire 51 is electrically connected to the first sub-wires 22, and the second sub-wires 52 are electrically connected to the first main wire 21. The isolation layer 30 is then removed.

Accordingly, the hollow wire includes upper layer of wires 51, 52 and lower layer of wires 21, 22 which are alternatively arranged with the upper layer of wires 51, 52. Thus, by this specific arrangement, both the series resistance and the interruption of capacitance are reduced, and the operation efficiency is improved.

The formula for calculating the resistance is $R=\rho*L/A$

Wherein R represents the resistance of the material, $\rho$ represents the resistivity, L is the length of the wire, and A is the cross sectional area of the wire.

If the wires are made of Aluminum and Copper, respectively, assuming that the length of the wires is 10, and assuming the thickness, the width and the cross sectional area are 1, the resistance for the wire made of Aluminum is 26.7 $\mu\Omega$, and the resistance for the wire made of Copper is 16.7 $\mu\Omega$.

If Aluminum and Copper are, respectively, used to make the hollow wire of the present invention, as shown in FIG. 9, the cross sectional area of the hollow area is 2 in length, 1 in depth and 1 in width. The two sub-wires 22, 52 are 4 in length, 1 in width and 8 in depth, the total length is 10 the same as the conventional wire. The resistance for the Aluminum is 8, and for the Copper is 5 $\mu\Omega$.

It is noted that the hollow wire of the present invention has less resistance regardless of the ratio of length and width of the sub-wires 22, 52.

While we have shown and described the embodiment in accordance with the present invention, it should be clear to those skilled in the art that further embodiments may be made without departing from the scope of the present invention.

What is claimed is:

1. A hollow wire comprising:
a base board;
a first main wire and first and second, separated and co-axial sections of a first sub-wire, with the first main wire and the first and second sections of the first sub-wire each having a bottom surface located on the base board, with the first main wire located intermediate and spaced from the first and second sections of the first sub-wire, with the first main wire and the first and second sections of the first sub-wire each having a top surface, with the top surfaces of the first main wire and the first and second sections of the first sub-wire being flush;
first and second portions of conductive material respectively located on two ends of the first main wire and spaced from each other;
third and fourth portions of conductive material respectively located on the first and second sections of the first sub-wire and being spaced from each other, with the first, second, third and fourth portions of conductive material being spaced from each other, with a bottom surface of the first and second portions of conductive material located on the top surface of the first main wire, with a bottom surface of the third and fourth portions of conductive material located on the top surface of the first and second sections of the first sub-wire, wherein a top surface of the first, second, third, and fourth sections of conductive material is flush with each other;

first and second separated and coaxial sections of a sub-wire axially formed on the top surface of the first and second sections of conductive material on the first main wire; and a second main wire connected across the third and fourth sections of conductive material on the first and second sections of the first sub-wire, with the first main wire located beneath the second main wire, with the second main wire located intermediate and spaced from the first and second sections of the second sub-wire, with the second main wire and the first and second sections of the second sub-wire havinig a bottom surface located on the top surfaces of the first, second, third and fourth sections of conductive material.

2. The wire as claimed in claim 1, wherein the first main wire is located perpendicular to the second main wire.

3. The wire as claimed in claim 1 or claim 2, wherein the first main wire, the first sub wire, the second main wire and the second sub-wire are made by Aluminum.

4. The wire as claimed in claim 1 or claim 2, wherein the first main wire, the first sub-wire, the second main wire and the second sub-wire are made by Copper.

5. The wire as claimed in claim 1, wherein the base board is a semi-conductor base board.

* * * * *